(12) United States Patent
Yajima

(10) Patent No.: US 8,416,223 B2
(45) Date of Patent: Apr. 9, 2013

(54) INTERCONNECTION LINE DEVICE, IMAGE DISPLAY APPARATUS, AND METHOD FOR MANUFACTURING INTERCONNECTION LINE DEVICE

(75) Inventor: Akihiro Yajima, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 757 days.

(21) Appl. No.: 12/561,343

(22) Filed: Sep. 17, 2009

(65) Prior Publication Data

US 2010/0066709 A1    Mar. 18, 2010

(30) Foreign Application Priority Data

Sep. 17, 2008    (JP) .................................. 2008-238676

(51) Int. Cl.
G06F 3/038    (2006.01)
(52) U.S. Cl.
USPC .............................. 345/204; 345/205; 345/77
(58) Field of Classification Search .................. 345/77, 345/204, 205; 349/12, 141, 149, 152, 158
See application file for complete search history.

(56) References Cited

U.S. PATENT DOCUMENTS

| | | | |
|---|---|---|---|
| 5,656,147 A * | 8/1997 | Ishimoto et al. ................. 205/96 |
| 6,104,465 A | 8/2000 | Na et al. |
| 6,373,546 B1 | 4/2002 | Kim |
| 6,614,500 B2 | 9/2003 | Kim |
| 6,950,165 B2 * | 9/2005 | Matsumoto et al. .......... 349/141 |
| 7,050,135 B2 | 5/2006 | Kim |
| 7,456,925 B2 | 11/2008 | Kim |
| 7,466,387 B2 | 12/2008 | Kim et al. |
| 7,719,650 B2 | 5/2010 | Sugiyama et al. |
| 7,868,988 B2 | 1/2011 | Kim et al. |
| 2001/0003477 A1 * | 6/2001 | Aoki et al. ..................... 349/152 |
| 2001/0023771 A1 * | 9/2001 | Izumi et al. .................. 174/52.1 |
| 2003/0169246 A1 * | 9/2003 | Park ................................ 345/204 |
| 2003/0184703 A1 * | 10/2003 | Greene et al. ................. 349/158 |
| 2007/0195254 A1 * | 8/2007 | Lee et al. ....................... 349/149 |
| 2008/0129898 A1 * | 6/2008 | Moon ............................. 349/12 |
| 2008/0143264 A1 * | 6/2008 | Minami et al. ............. 315/169.3 |
| 2009/0146929 A1 * | 6/2009 | Kim et al. ........................ 345/77 |

FOREIGN PATENT DOCUMENTS

| | | |
|---|---|---|
| CN | 1892372 A | 1/2007 |
| JP | 10-153791 | 6/1998 |
| JP | 10-253992 | 9/1998 |
| JP | 2002-139741 | 5/2002 |
| JP | 2003-140181 | 5/2003 |
| JP | 2004-70317 | 3/2004 |

OTHER PUBLICATIONS

Chinese Office Action, Application No. 200910174739.3 dated Dec. 29, 2011.
Japanese Office Action dated Dec. 12, 2012 in corresponding Japanese Patent Application No. 2008-238676 with English translation of enclosed wavy line portions of Japanese Office Action.

* cited by examiner

Primary Examiner — Thuy Pardo
(74) Attorney, Agent, or Firm — Young & Thompson

(57) ABSTRACT

An interconnection line device includes an insulating layer for electrical insulation; an external connection terminal which is formed on one surface of the insulating layer; an interconnection line which is formed on another surface of the insulating layer and whose one end portion area is connected to a predetermined signal line; and a connection portion which is arranged so as to penetrate through the insulating layer and connects another end portion area of the interconnection line to the external connection terminal.

11 Claims, 16 Drawing Sheets

INTERCONNECTION LINE DEVICE, IMAGE DISPLAY APPARATUS, AND METHOD FOR MANUFACTURING INTERCONNECTION LINE DEVICE

This application is based upon and claims the benefit of priority from Japanese Patent Application No. 2008-238676, filed on Sep. 17, 2008, the disclosure of which is incorporated herein in its entirety by reference.

TECHNICAL FIELD

The present invention relates to an interconnection line device which connects a signal line to a driving circuit, an image display apparatus and a method for manufacturing an interconnection line device.

BACKGROUND ART

An image display apparatus having a display panel such as a liquid crystal panel or the like is provided in the market. This liquid crystal panel is a flat panel display that is thin, lightweight and low power consumption. The liquid crystal panel has a display area arranged in a central portion of the panel in which an image is displayed, a frame area which is arranged in an area surrounding the display area, and a terminal area which is arranged in an area surrounding the frame area. A plurality of scanning lines and data lines which are perpendicular to each other are arranged in the display area. Each scanning lines are regular intervals with each other and are arranged in parallel, and each data lines are regular intervals with each other and are arranged in parallel. One pixel is formed in a minimum area surrounded by the scanning line and the data line. A plurality of external connection terminals which are connected to output pins (output terminals) of a driving circuit that outputs a control signal are formed in the terminal area. A plurality of interconnection lines for connecting the scanning line and the data line with the external connection terminal are formed in the frame area.

The control signal from the output pins of the driving circuit is transmitted through the external connection terminal, the scanning line and the data line, and applied to a pixel. Because the transmittance of the pixel is controlled by this control signal, an image display apparatus can perform the image display. In the following description, the scanning line and the data line are described generically as a signal line, and the distance between adjacent signal lines is described as a signal line pitch. One group of external connection terminals that correspond to the number of output pins of the driving circuit is described as a terminal block. Accordingly, the plurality of external connection terminals are divided into many terminal blocks. The spacing between the adjacent external connection terminals in the terminal block is described as a terminal pitch.

Generally, because the signal line pitch is greater than the terminal pitch, the signal line is connected to the external connection terminal with the interconnection line by performing a pitch adjustment of the signal line pitch and the terminal pitch. Because the length of the interconnection line differs depending on locations at which the external connection terminal and the signal line are arranged, the resistance value of each interconnection line differs depending on the locations at which the external connection terminal and the signal line are arranged. When the resistance value of the interconnection line is large, signal degradation of the control signal transmitted from the external connection terminal to the pixel becomes large. The signal degradation causes image quality degradation of a displayed image.

By the way, the length of each interconnection line connected in the one terminal block does not change rapidly, but changes gradually. Because the resistance value difference between the adjacent interconnection lines is small, image quality difference between the adjacent interconnection lines become small. Therefore the image quality degradation is invisible.

However, the length of the interconnection line in one terminal block largely differs from the length of the interconnection line in another terminal block. Especially, the length of the interconnection line located at the end of one terminal block largely differs from the length of the interconnection line that is adjacent to the above interconnection line in the one terminal block and located at the end of another adjacent terminal block. When the length difference between the adjacent interconnection lines is large, the resistance difference between the adjacent interconnection lines is large and the image quality difference between them becomes large. Accordingly, the image quality degradation becomes visible.

Accordingly, a technology with which the image quality degradation is suppressed by making the resistance values of the interconnection line equal to each other has been developed. For example, a technology with which the resistance values of the interconnection line are made equal to each other by forming the interconnection line in a meandering shape and differentiating the widths of the interconnection line from each other is proposed in Japanese Patent Application Laid-Open No. 1998-153791 and Japanese Patent Application Laid-Open No. 2003-140181.

When the resistance values of the interconnection line are made equal to each other by forming the interconnection line in a meandering shape and differentiating the widths of the interconnection line from each other, a space in which the interconnection line is formed in the meandering shape and the widths of the interconnection line are differentiated from each other is necessary. Additionally, when the width of the interconnection line is expanded, a space in which the width of the interconnection line is expanded while preventing a short circuit between the interconnection lines is necessary.

It has been required to develop a display panel whose image display density is high and whose frame area is small for an image display apparatus. However, it is difficult to secure the above-mentioned space while satisfying these requirements. Therefore, it has been difficult to produce an image display apparatus having high image quality because the resistance values of the interconnection line cannot be made sufficiently equal to each other.

SUMMARY

A main purpose of the present invention is to provide an interconnection line device in which the resistance values of the interconnection line are made equal to each other even when an image display apparatus has a small frame area, an image display apparatus, and a method for manufacturing an interconnection line device.

An interconnection line device includes an insulating layer for electrical insulation; an external connection terminal which is formed on one surface of the insulating layer: an interconnection line which is formed on another surface of the insulating layer and whose one end portion area is connected to a predetermined signal line; and a connection portion which is arranged so as to penetrate through the insulating layer and connects another end portion area of the interconnection line to the external connection terminal.

BRIEF DESCRIPTION OF THE DRAWINGS

Exemplary features and advantages of the present invention will become apparent from the following detailed description when taken with the accompanying drawings in which.

EXEMPLARY EMBODIMENT

Exemplary embodiments of the present invention will now be described in detail in accordance with the accompanying drawings.

<1. Study of Related Art>

Figure 1:
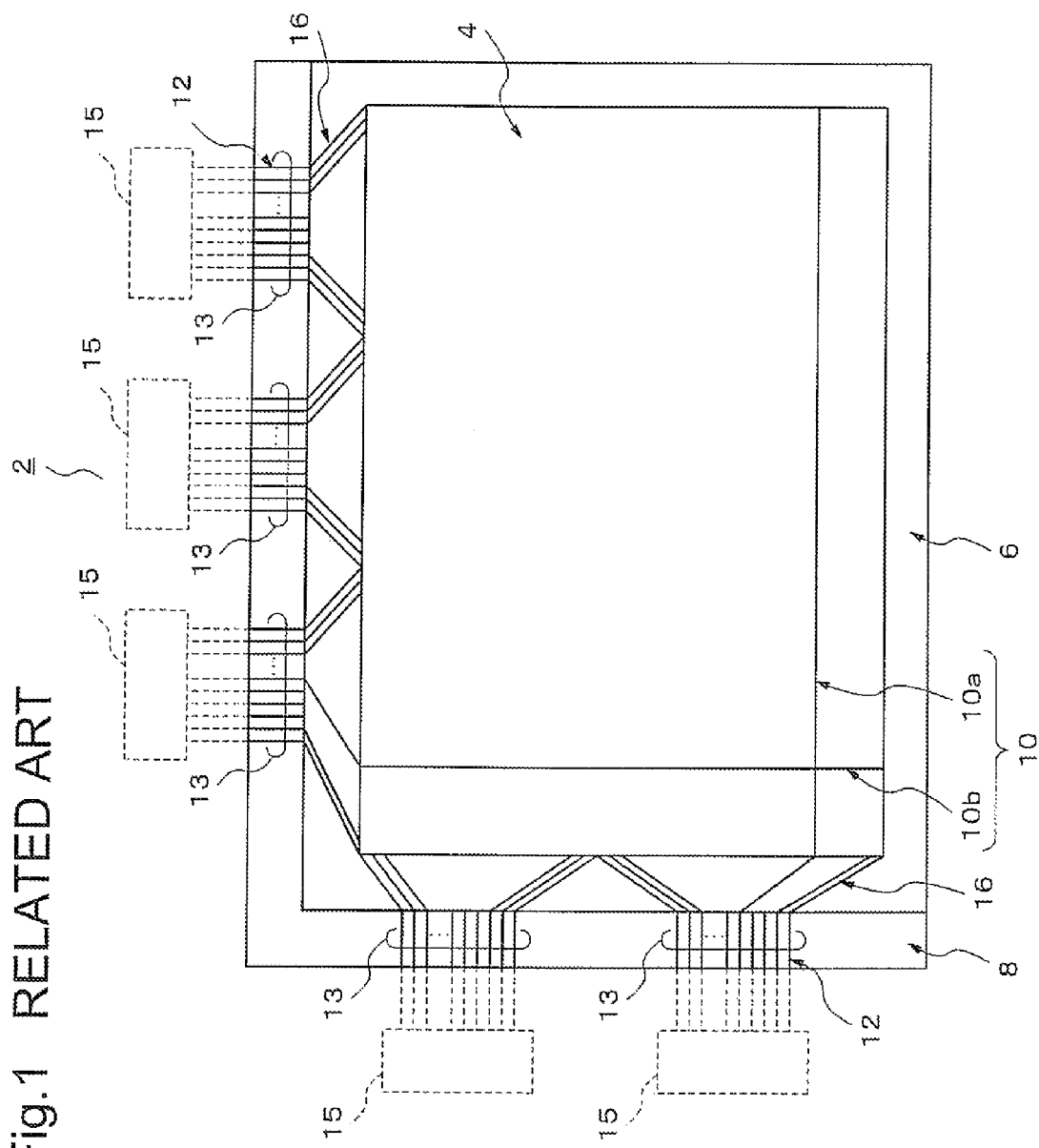
FIG. 1 is a top view of a liquid crystal panel according to a related art.
Figure 2:
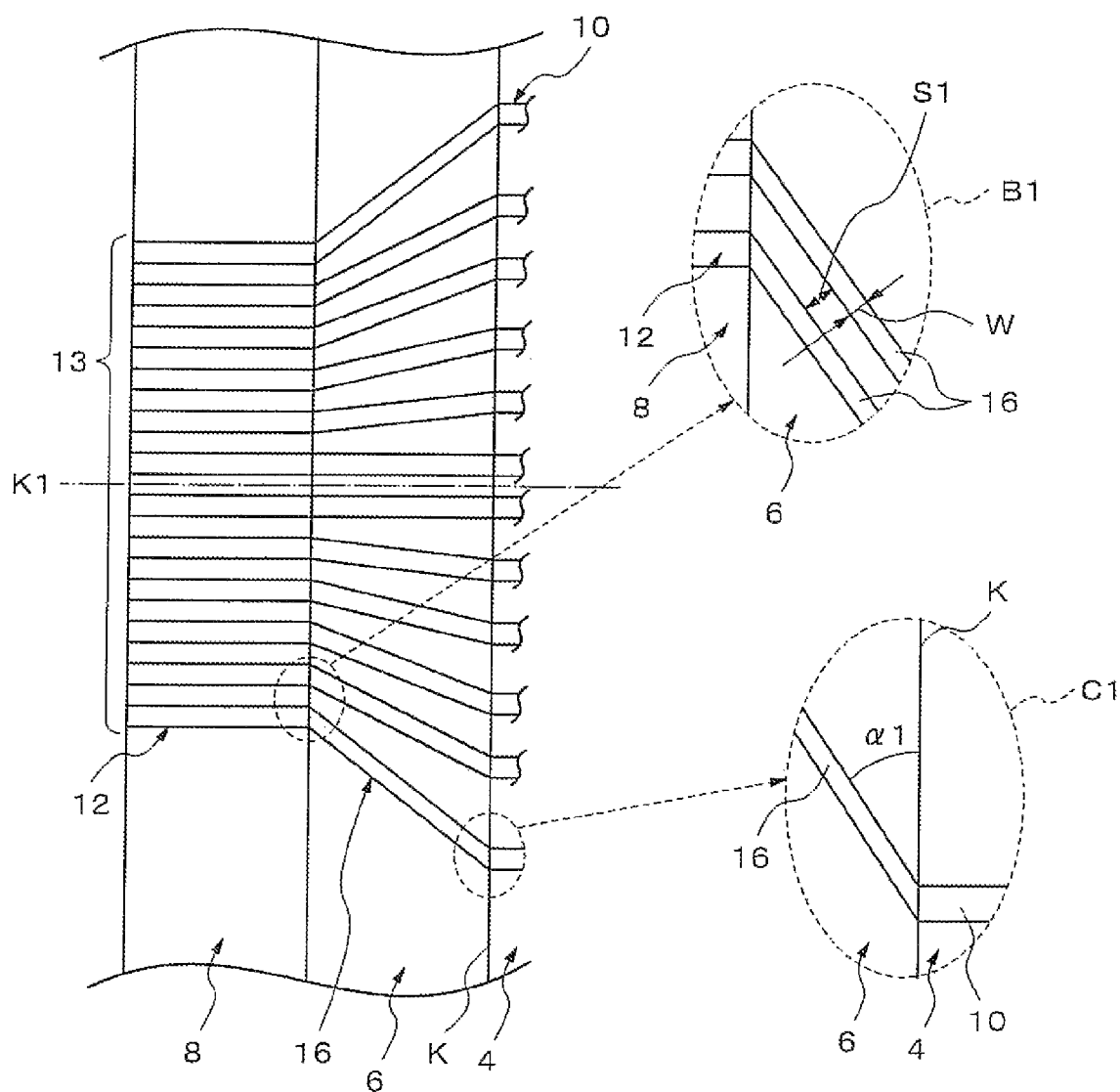
FIG. 2 is a partial top view of a liquid crystal panel according to a related art which has a terminal area in which the interconnection lines are arranged symmetrically to a center line of a terminal block and a frame area.
Figure 3:
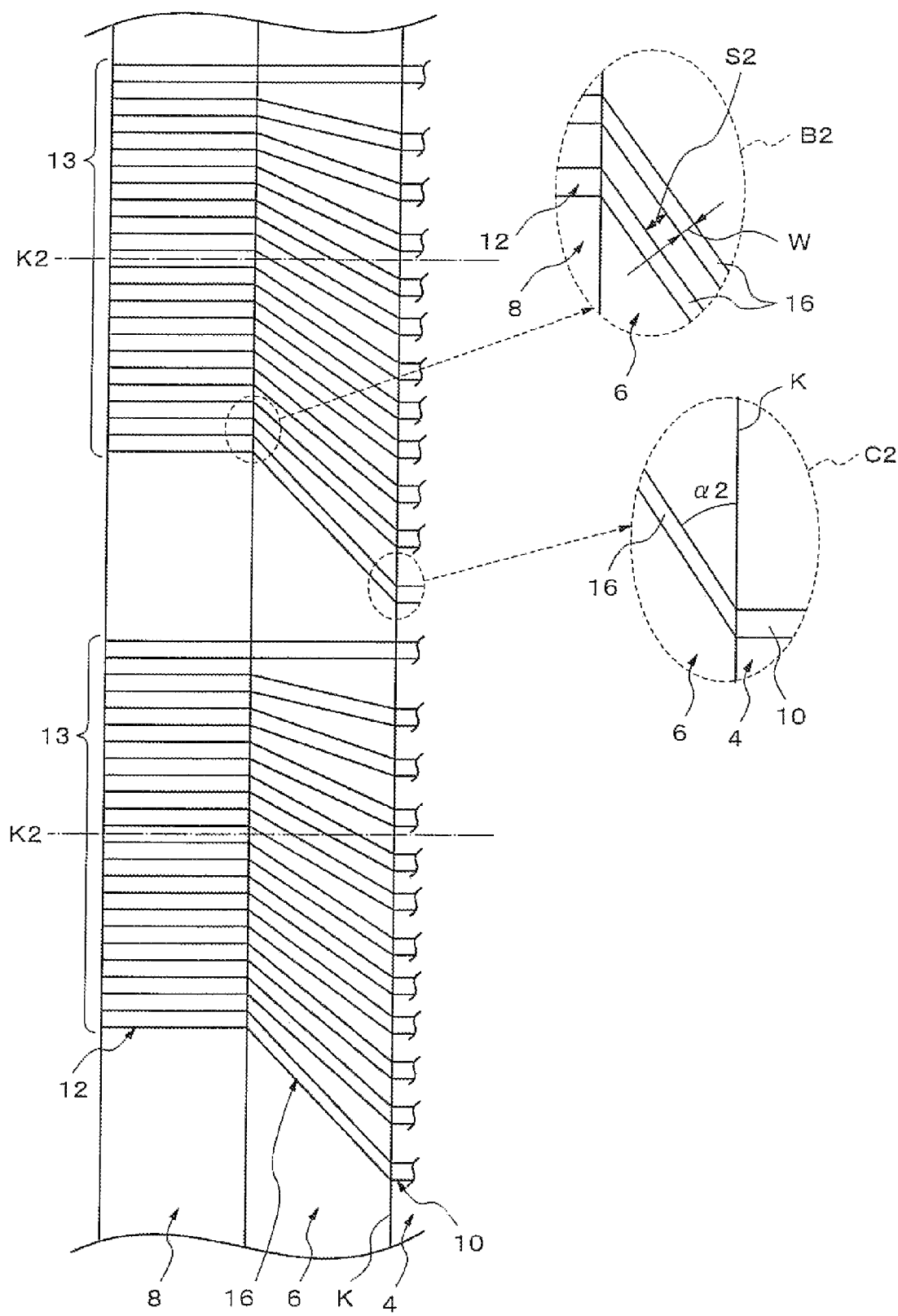
FIG. 3 is a partial top view of a liquid crystal panel according to a related art which has a terminal area in which the interconnection lines are arranged asymmetrically to a center line of a terminal block and a frame area.

First, a problem in the related art will be studied in detail. FIG. 1 is a top view of a conventional liquid crystal panel 2 according to the related art. The liquid crystal panel 2 includes a display area 4, a frame area 6 and a terminal area 8. Signal lines 10 such as a plurality of scanning lines 10$a$, a plurality of data lines 10$b$, and the like are provided in the display area 4. The scanning lines 10$a$ and the data lines 10$b$ cross at right angle so as to form a mesh. A plurality of external connection terminals 12 are formed in the terminal area 8. These external connection terminals 12 are divided into blocks so that one terminal block 13 corresponds to one driving circuit 15. A plurality of interconnection lines 16 which connect the signal lines 10 to the external connection terminals 12 are formed in the frame area 6. Further, in FIG. 1 and others, a part of the plurality of signal lines 10 and a part of the plurality of external connection terminals 12 are omitted for simplification of the figure. FIG. 2 is a partial top view of a liquid crystal panel according to a related art which has the terminal area 8 in which the interconnection lines 16 are arranged symmetrically to a center line K1 of the terminal block 13 and the frame area 6. FIG. 3 is a partial top view of a liquid crystal panel according to a related art which has the terminal area 8 in which the interconnection lines 16 are arranged asymmetrically to a center line K2 of the terminal block 13 and the frame area 6. Enlarged views B1 and B2 in FIG. 2 and FIG. 3 show a boundary portion between the terminal area 8 and the frame area 6 and enlarged views C1 and C2 show a boundary portion between the display area 4 and the frame area 6. As shown in FIG. 2 and FIG. 3, the appearance of the terminal block 13 is rectangular when viewing from an upper side of a liquid crystal panel.

The interconnection lines 16, the external connection terminals 12, the signal line 10 and the like are formed by using a photolithography technology. The line width of the interconnection line 16 is decided so that a process condition (for example, the minimum spacing between the adjacent interconnection lines 16) such as a resolution or the like in the photolithography technology is satisfied and the resistance values of the plurality of interconnection lines 16 are made equal to each other. For example, when the length of the interconnection line 16 is long, the line width is made wide so as to reduce the resistance value and when the length of the interconnection line 16, is short, the line width is made small so as to increase the resistance value. Accordingly, the resistance value difference between the long interconnection line 16 and the short interconnection line 16 can be made small.

Further, as shown in enlarged view C1 in FIG. 2 and enlarged view C2 in FIG. 3, when an acute angle between a line K parallel to the longitudinal direction of the terminal area 8 and the interconnection line 16 in the frame area 6 in the boundary area between the display area 4 and the frame area 6 is defined as interconnection angle $\alpha 1$ or $\alpha 2$, the interconnection angles $\alpha 1$ and $\alpha 2$ of the interconnection line 16 differ from each other for each interconnection line 16. When the interconnection angles α1 and α2 are small, as shown in enlarged view B1 in FIG. 2 and enlarged view B2 in FIG. 3, the spacings S1 and S2 between the adjacent interconnection lines 16 (distance between the adjacent lines) are small. The minimum value of the distance between the adjacent lines S1 and S2 are determined by the process condition such as a resolution or the like in a photolithography technology mentioned above and the line width W of the interconnection line 16 cannot be made wide optionally. Namely, there is an upper limit of the line width of the interconnection line 16.

Figure 4:
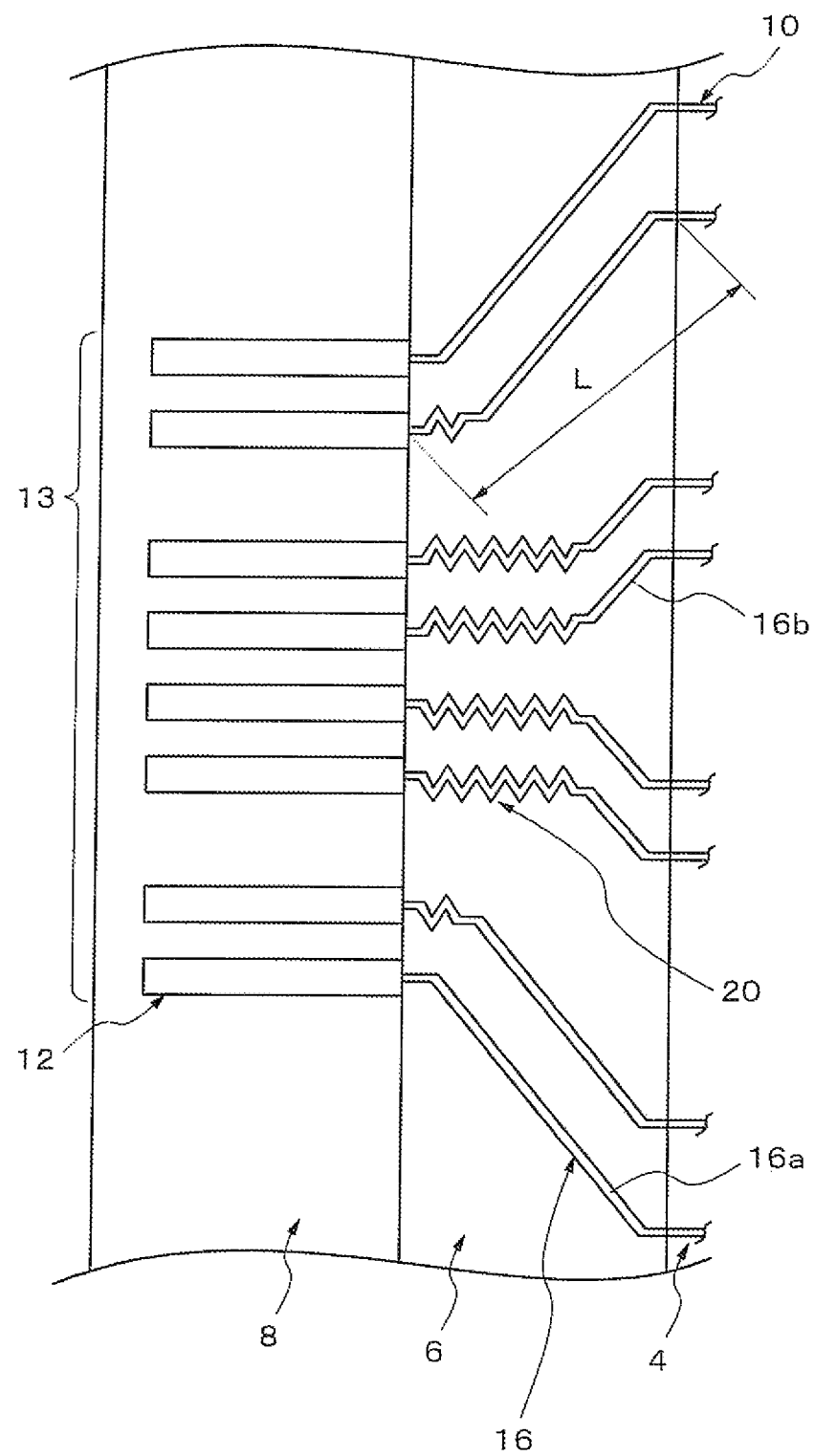
FIG. 4 is a partial top view of a liquid crystal panel according to a related art in which the interconnection lines are arranged in a meandering shape.

A method with which the resistance values of the interconnection line are made equal to each other by forming the interconnection line 16 in a meandering shape as shown in FIG. 4 is disclosed in Japanese Patent Application Laid-Open No, 2003-140181. Further, FIG. 4 is a partial top view of a liquid crystal panel in which the interconnection lines are formed in a meandering shape. As shown in FIG. 4, as for the interconnection line 16a of which a linear distance L between the external connection terminal 12 and the signal line 10 is large, the line width thereof is made wide and as for the interconnection line 16b of which the linear distance L between the external connection terminal 12 and the signal line 10 is small, the line width thereof is made small and it is formed in a meandering shape. In this case, a space in which the interconnection line 16b is formed in a meandering shape is needed. In recent years, a high-resolution liquid crystal panel in which the number of pixels is increased without changing the size of the display area 4 or the size of the frame area 6 is reduced is being developed. When the number of pixels is increased, the number of the interconnection lines is increased. The number of pins used for a driving circuit is increased (the number of output pins is increased) together with the technical development of the high-resolution liquid crystal panel. When the number of the interconnection lines and the number of pins used for the driving circuit are increased, a pitch difference between a signal line pitch and a terminal pitch becomes large. Therefore, it becomes increasingly difficult to make the line width of the interconnection line wide. Because a large number of interconnection lines have to be formed in a small frame area, it becomes increasingly difficult to ensure a space in which the interconnection line is formed in the meandering shape.

Figure 5:
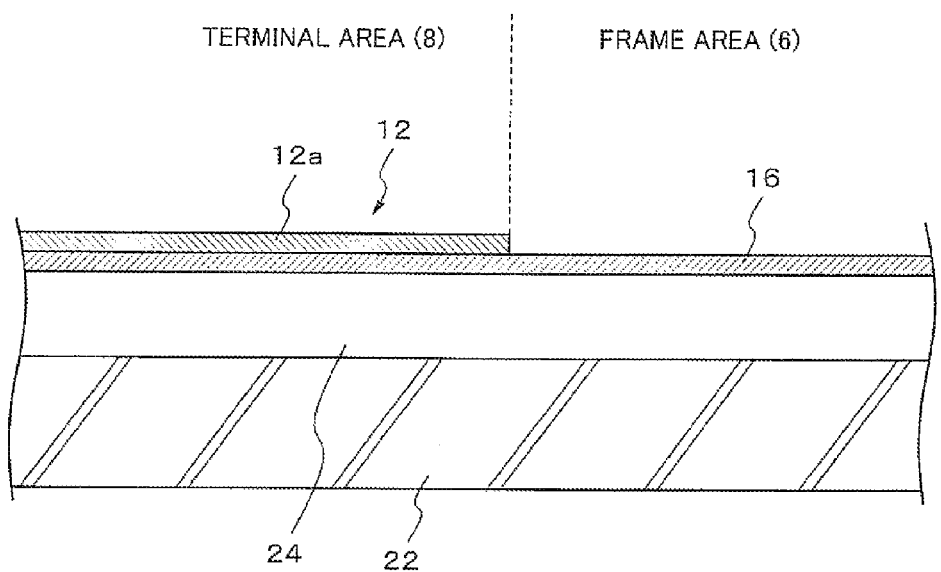
FIG. 5 is a fragmentary sectional view of a display panel according to a related art which includes an external connection terminal.

The interconnection line device for a display panel including such external connection terminal 12 and interconnection line 16 will be described in detail with reference to FIG. 5. FIG. 5 is a fragmentary sectional view of a display panel including the external connection terminal 12. This display panel has a structure in which an insulating layer 24 is formed on a glass substrate 22 and the interconnection line 16 is formed on the insulating layer 24. Additionally, transparent wiring 12a formed of ITO (Indium Tin Oxide) or the like is formed on the interconnection line 16. An area in which the transparent wiring 12a and the interconnection line 16 overlap is the terminal area 8. The external connection terminal 12 is formed in this area. There is no interconnection line in an area between the glass substrate 22 and the insulating layer 24.

An inventor of the present application finds that even in a high resolution liquid crystal panel having a small frame area, the resistance values of the interconnection line can be made equal to each other by forming the interconnection lines in the area between the glass substrate 22 and the insulating layer 24 that has not been used up to now.

<2. First Exemplary Embodiment>

Figure 6:
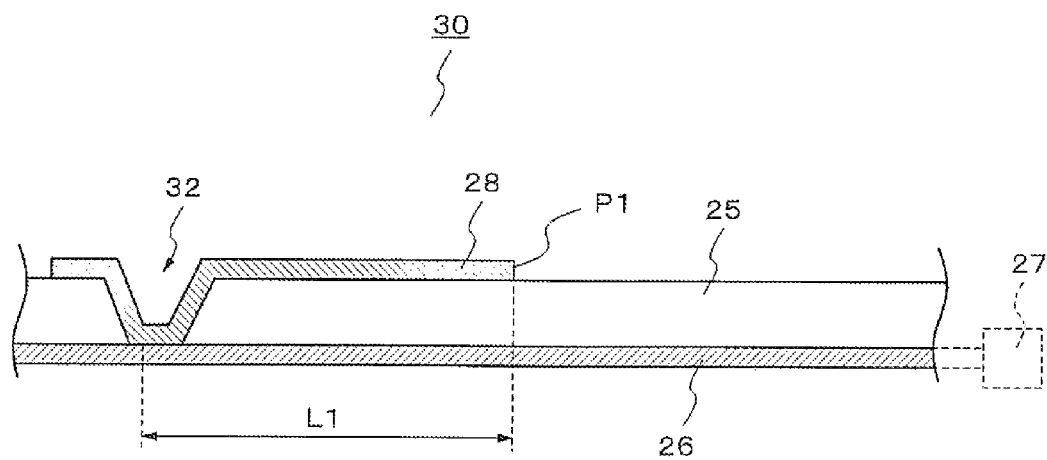
FIG. 6 is a fragmentary sectional view of a liquid crystal panel having an interconnection line device according to a first exemplary embodiment of the present invention.

The first exemplary embodiment of the invention which has been completed based on the idea mentioned above will be described. FIG. 6 is a fragmentary sectional view of an interconnection line device 30 according to the first exemplary embodiment. The interconnection line device 30 comprises an external connection terminal 28, an insulating layer 25, an interconnection line 26 and a connection portion (contact hole) 32. The external connection terminal 28 is a terminal of an electric conductor to which a control signal that is applied to the pixel is inputted. The insulating layer 25 is an electric insulator and the interconnection line 26 is an electric conductor. The contact hole 32 is formed through the insulating layer 25. The insulating layer 25 insulates the external connection terminal 28 from the interconnection line 26 electrically. One end side of the interconnection line 26 is connected to a signal line 27 and another end side is connected to the external connection terminal 28 via the contact hole 32 formed in the insulating layer 25.

By using above mentioned structure, the length of the interconnection line 26 can be increased by a length L1 that is equal to a distance from an end portion P1 of a signal line 27 side in the external connection terminal 28 to the contact hole 32. Accordingly, because an area in which the resistance value of the interconnection line 26 is adjusted can be extended, the resistance values of the interconnection line 26 are made equal to each other.

<3. Second Exemplary Embodiment>

Figure 7:
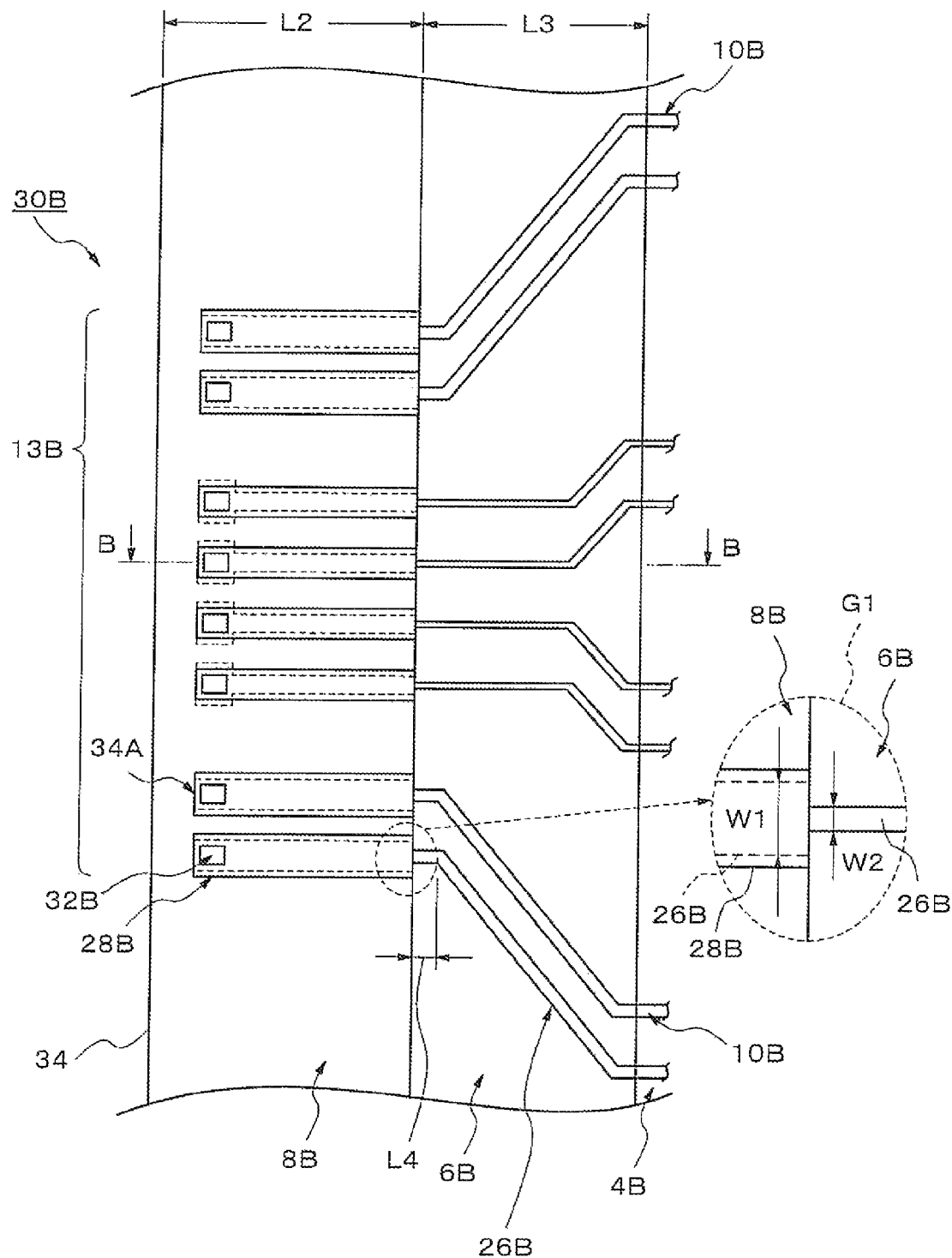
FIG. 7 is a partial top view of a liquid crystal panel having an interconnection line device according to a second exemplary embodiment of the present invention.
Figure 8:
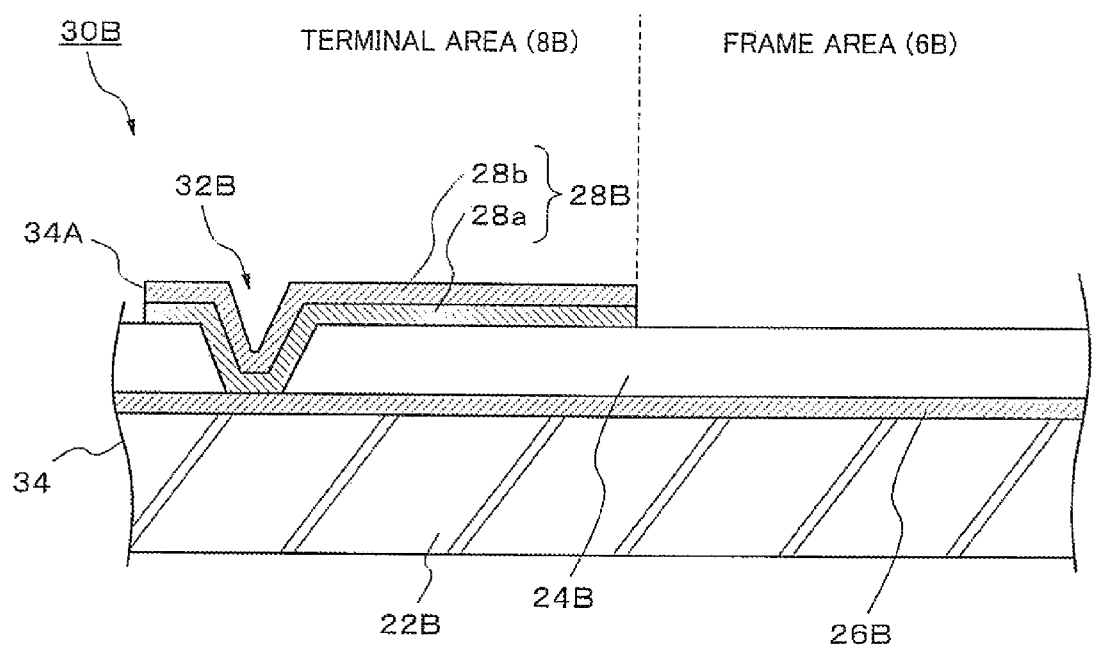
FIG. 8 is a cross sectional view showing a cross section of a liquid crystal panel along a line B-B in FIG. 7.
Figure 9:
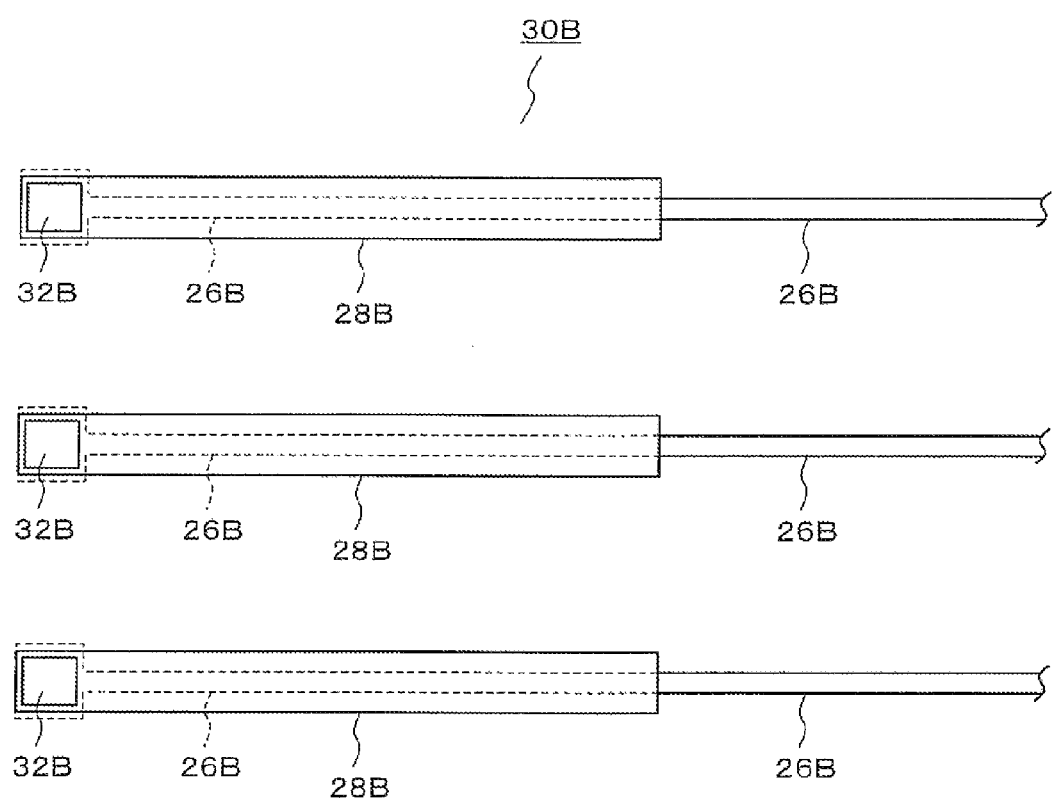
FIG. 9 is a partial top view of a liquid crystal panel, in which an external connection terminal of an interconnection, line device of the second exemplary embodiment is enlarged.

Next, a second exemplary embodiment of the present invention will be described. FIG. 7 is a partial top view of a liquid crystal panel having an interconnection line device 30B according to the second exemplary embodiment. Further, enlarged view G1 in FIG. 7 shows a boundary area between a frame area 6B and a terminal area 8B of a liquid crystal panel. FIG. 8 is a cross sectional view showing a cross section of a liquid crystal panel along a line BB in FIG. 7, and FIG. 9 is a partial top view of a liquid crystal panel, in which an external connection terminal 28B is enlarged.

As shown in FIG. 8, the interconnection line device 30B includes the external connection terminal 28B and an interconnection line 26B between which an insulating layer 24B is interposed. Further, a contact hole (connection portion) 32B is formed in the insulating layer 24B. The interconnection line 26B is formed between a glass substrate 22B and the insulating layer 24B.

The insulating layer 24B is a film for insulating the external connection terminal 2813 from the interconnection line 26B electrically and a material such as silicon dioxide, silicon nitride or the like can be used for the film. The interconnection line 26B is a single layer film or a multilayer film which contains materials such as chromium, molybdenum, aluminum, and the like. The external connection terminal 28B is a laminated body in which a wiring 28a made of a metallic material which contains materials such as chromium, molybdenum, aluminum and the like and a wiring 28b made of a transparent material such as ITO (indium tin oxide) or the like are stacked together.

Figure 10:
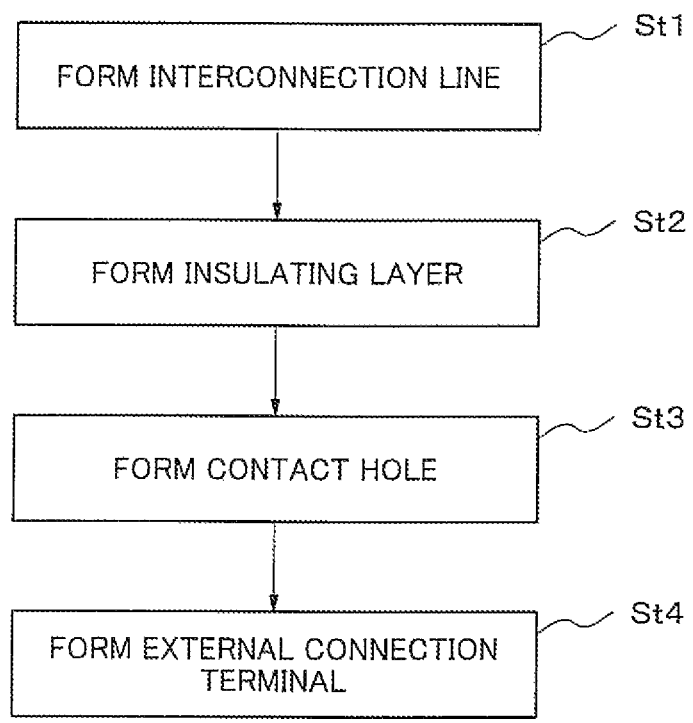
FIG. 10 is a flowchart of a method for manufacturing an interconnection line device according to a second exemplary embodiment.

Next, a method for manufacturing such interconnection line device 3013 will be described with reference to a flow chart shown in FIG. 10. First, a metallic film which contains materials such as chromium, molybdenum, aluminum, and the like is formed on the glass substrate 2213 by using a sputtering method or the like. After that, by using a photolithography technology and an etching technology, the interconnection lines 26B are formed by patterning the metallic film (step St1).

Next, by forming a film of silicon dioxide or silicon nitride on the whole surface of the glass substrate 228 from above the interconnection line 26B by using a CVD (Chemical Vapor Deposition) method or the like, the insulating layer 24B is formed (step St2).

After that, the contact holes 32B are formed in the insulating layer 24B by using a photolithography technology and an etching technology (step St3).

After forming the contact holes 32B, a metallic film which contains materials such as chromium, molybdenum, aluminum, and the like is formed on the whole surface of the insulating layer 24B, and an ITO film is formed on it. The external connection terminals 28B are formed by patterning the metallic film and the ITO film by using a photolithography technology and an etching technology (step St4).

As shown in FIG. 7, the external connection terminals 28B and the interconnection lines 26B that are formed by such method are electrically connected to each other at the position of the contact holes 32B. These contact holes 32B are formed in a vicinity of an end portion 34A of the external connection terminals 28B of an outer edge 34 side of a liquid crystal panel. As shown in FIG. 7, when the length of the interconnection lines 26B are made longer, the line width thereof are made wider and when the length of the interconnection lines 26B are made shorter, the line width thereof are made smaller. Because the contact holes 32B are formed in the vicinity of the end portion 34A of the external connection terminals 28B which are located most far from a display area 41B, the length of the interconnection line 26B can be extended by a length that is equal to a width L2 of the terminal area 8B as a maximum value.

Generally, the width L2 of the terminal area 8B is about 1.5 to 3 mm and a width L3 of the frame area 6B is about 2 to 5 mm. Accordingly, the length of the interconnection line 26B can be extended by about 1.5 to 3 mm substantially.

As shown in FIG. 7, the interconnection line 26B and the external connection terminal 28B overlap in the terminal area 8B and all the interconnection lines 26B are parallel to each other. Each interconnection line 26B is extended in the frame area 6B by a predetermined length L4 and subsequently, the interconnection line 26B is extended toward a signal line 10B at a predetermined interconnection angle. As mentioned above, because all the interconnection lines 26B are parallel to each other in the terminal area 8B, a distance between the adjacent interconnection lines 26B in this terminal area 8B becomes maximum. Accordingly, the line width of the interconnection line 26B can be made wide.

In order to suppress characteristic variance such as degradation of a control signal or the like, it is desirable that the resistance values of all the interconnection lines are equal to each other and in order to suppress the degradation amount of the control signal, it is desirable that the resistance value of the interconnection line is small. However, when the interconnection line 26B is connected to the external connection terminal 28B in the terminal area 8B, the length of the interconnection line 26B becomes long and the resistance value of the interconnection line 26B increases by the resistance value of the extended portion. In this case, as shown in enlarged view G1 in FIG. 7, the line width W1 of the interconnection line 26B in the terminal area 8B is made wider than the line width W2 of the interconnection line 26B in the frame area 6B.

Namely, the line width of the interconnection line 26B in the terminal area 8B is made different from that in the frame area 6B. Because the resistance value is inversely proportional to the line width, increase of the resistance value of the interconnection line 26B in the terminal area 8B can be suppressed by making the line width W1 of the interconnection line 26B in the terminal area 8B wider than the line width W2 of the interconnection line 26B in the frame area 6B.

Therefore, the resistance values of the interconnection line 26B can be made equal to each other while suppressing increase of the resistance value of each interconnection line 26B. Namely, the degradation amount can be suppressed while suppressing variance of degradation of the control signal.

Figure 11:
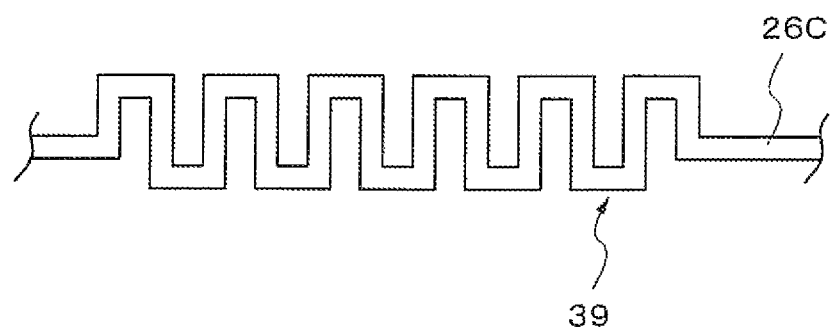
FIG. 11 is a partial top view of an interconnection line formed in a meandering shape according to a second exemplary embodiment.

Although the interconnection line mentioned above is formed as a straight line without meandering, it may be formed in a meandering shape. FIG. 11 is a partial top view of an interconnection line 26C including a meandering section 39. Because the length of the interconnection line 26C can be increased with this meandering section 39, the resistance value of the interconnection line 26C can be effectively made large. The number of meander turns or the like is decided appropriately according to the resistance value of the interconnection line 26C.

Figure 12:
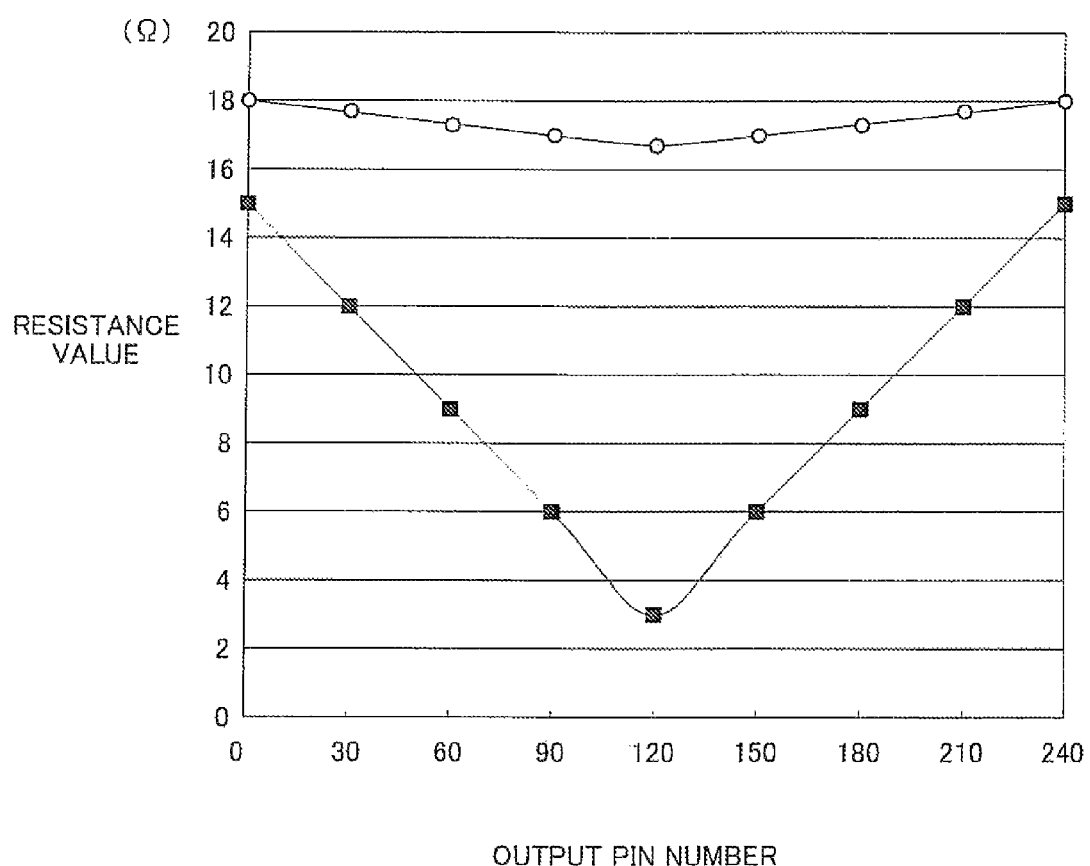
FIG. 12 shows a result of measurement of the resistance value of the interconnection lines in one terminal block with respect to an interconnection line device according to a second exemplary embodiment and an interconnection line device according to a related art.

FIG. 12 shows a comparison between the resistance values of the interconnection lines in one terminal block of the interconnection line device according to the second exemplary embodiment shown in FIG. 7 and the resistance values of the interconnection line device according to the related art shown in FIG. 2. Wherein, the interconnection line does not include the meandering section. In FIG. 12, the resistance value of the interconnection line of the interconnection line device according to the second exemplary embodiment is indicated by a white circle symbol "○" and the resistance value of the interconnection line of the interconnection line device according to the related art is indicated by a black square symbol "■". These resistance values are the measured values. FIG. 12 is a graph of the resistance value of the interconnection line connected to the output pin of the external connection terminal 28B versus the output pin number of the external connection terminal 28B in the terminal block 13B shown in FIG. 7.

The resistance values of the interconnection lines of the interconnection line device according to the related art are largely different from each other. However, the resistance values of the interconnection line can be made equal to each other by forming the interconnection line in the meandering shape or adjusting the line width, but it requires a large space for arranging the meandering interconnection line. As mentioned above, it is very difficult to secure the large space. Accordingly, the resistance values of the interconnection line cannot be made sufficiently equal to each other.

However, in case of the interconnection line device according to the second exemplary embodiment, the resistance values of the interconnection lines are not largely different from each other. That is because the interconnection line is extended up to the position of the contact hole in the terminal area, a space for adjusting the resistance value is expanded and the adjustment of the resistance values of the interconnection line is sufficiently achieved. Accordingly, an interconnection line device in which the resistance values of the interconnection line are made sufficiently equal to each other can be produced without changing the outside dimensions or the like of a liquid crystal panel. An image display apparatus having high image quality can be produced by using such interconnection line device.

Because the frame area is extended to the terminal area substantially, the width of the terminal area can be made small. Accordingly, a display area can be extended by an area obtained by reducing the width of the terminal area without using a large-sized glass substrate for a liquid crystal panel. In other words, a liquid crystal panel which can maintain the size of the display area while using a small-sized glass substrate can be produced.

<4. Third Exemplary Embodiment>

Next, a third exemplary embodiment of the present invention will be described. Further, the same reference numbers are used for the same structure as the second exemplary embodiment and the description thereof will be omitted appropriately. An interconnection line of an interconnection line device according to the third exemplary embodiment is formed approximately in a straight line. Namely, as shown in FIG. 7, for example, the interconnection line of the interconnection line device according to the second exemplary embodiment is bent so as to go toward the signal line in the frame area. In contrast, the interconnection line of the interconnection line device according to the third exemplary embodiment is bent so as to go toward the signal line in the terminal area.

Figure 13:
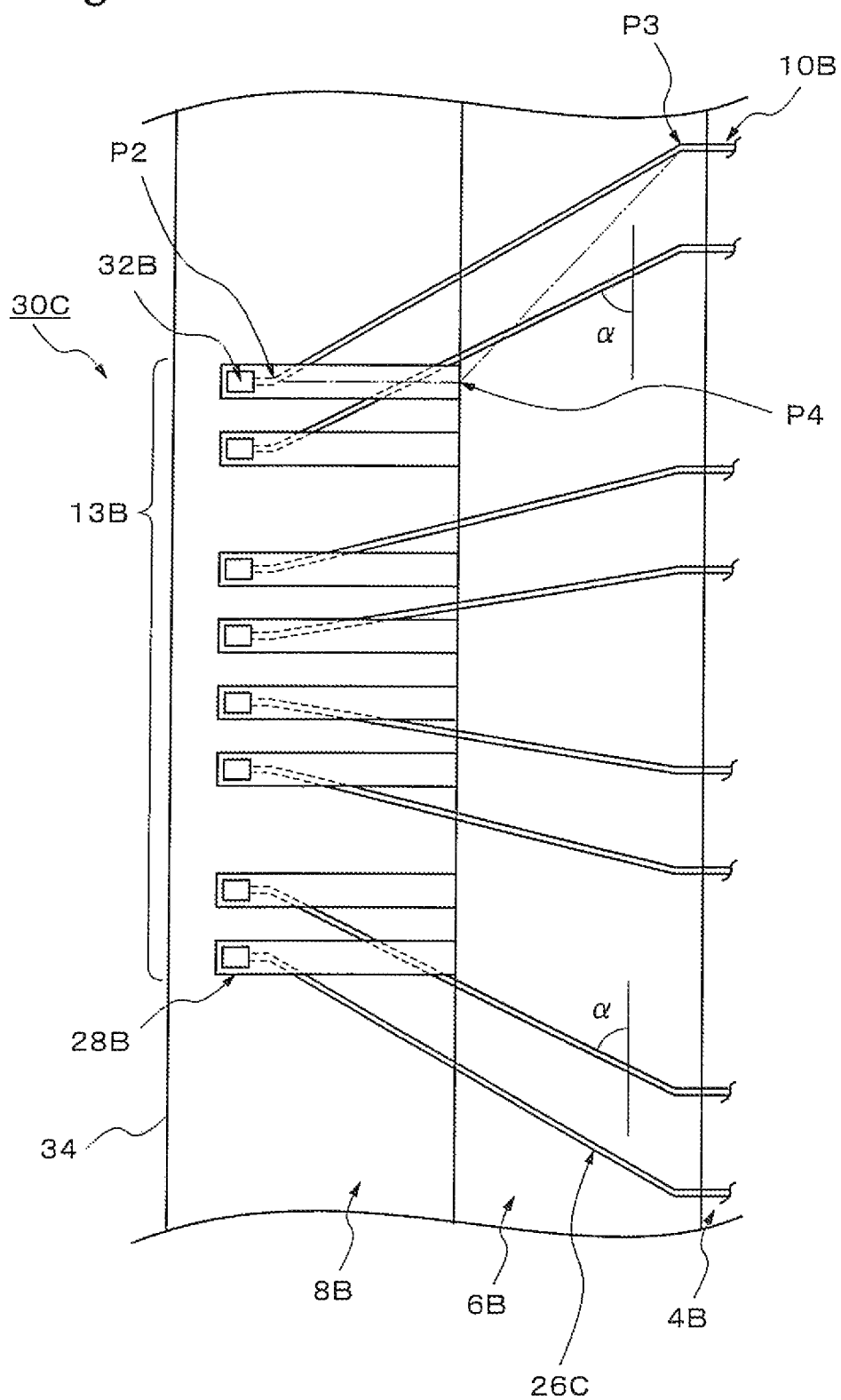
FIG. 13 is a partial top view of a liquid crystal panel having an interconnection line device according to a third exemplary embodiment of the present invention.

FIG. 13 is a partial top view of a liquid crystal panel having an interconnection line device 30C of the third exemplary embodiment. The interconnection line 26C is insulated from the external connection terminal 28B via an insulating layer. One end portion area of the interconnection line 26C is electrically connected to the external connection terminal 28B at the position of the contact hole 32B and another end portion of the interconnection line 26C is connected to the signal line 10. At this time, the interconnection line 26C is bent at a point P2 located in the vicinity of the contact hole 32B and bent at a point P3 located in the vicinity of the signal line 10.

In FIG. 13, the interconnection line 26C indicated by a single dot chain line is bent in the direction toward the signal line 10 at a point P4 on the boundary between the terminal area 8B and the frame area 6B. Because the points P2, P3 and P4 are triangle vertices, the distance from the point P2 to the point P3 is shorter than the distance from the point P2 to the point P3 via the point P4. This means that the length of the interconnection line 26C in which the interconnection line 26C is bent once in the terminal, area 8B and once in the frame area 6B is shorter than the length of the interconnection line 26C in which the interconnection line 26C is bent twice in the frame area 68. Because the length of the line becomes short, the resistance value becomes small. Accordingly, the resistance values of the interconnection line can be made equal to each other and the average resistance values of the interconnection line can be made small. As described above, when the resistance value of the interconnection line is small, degradation of the control signal is reduced. Therefore, a display panel in which degradation of the image quality of the displayed image is suppressed and whose image quality is uniform within the display screen is realized.

Figure 14:
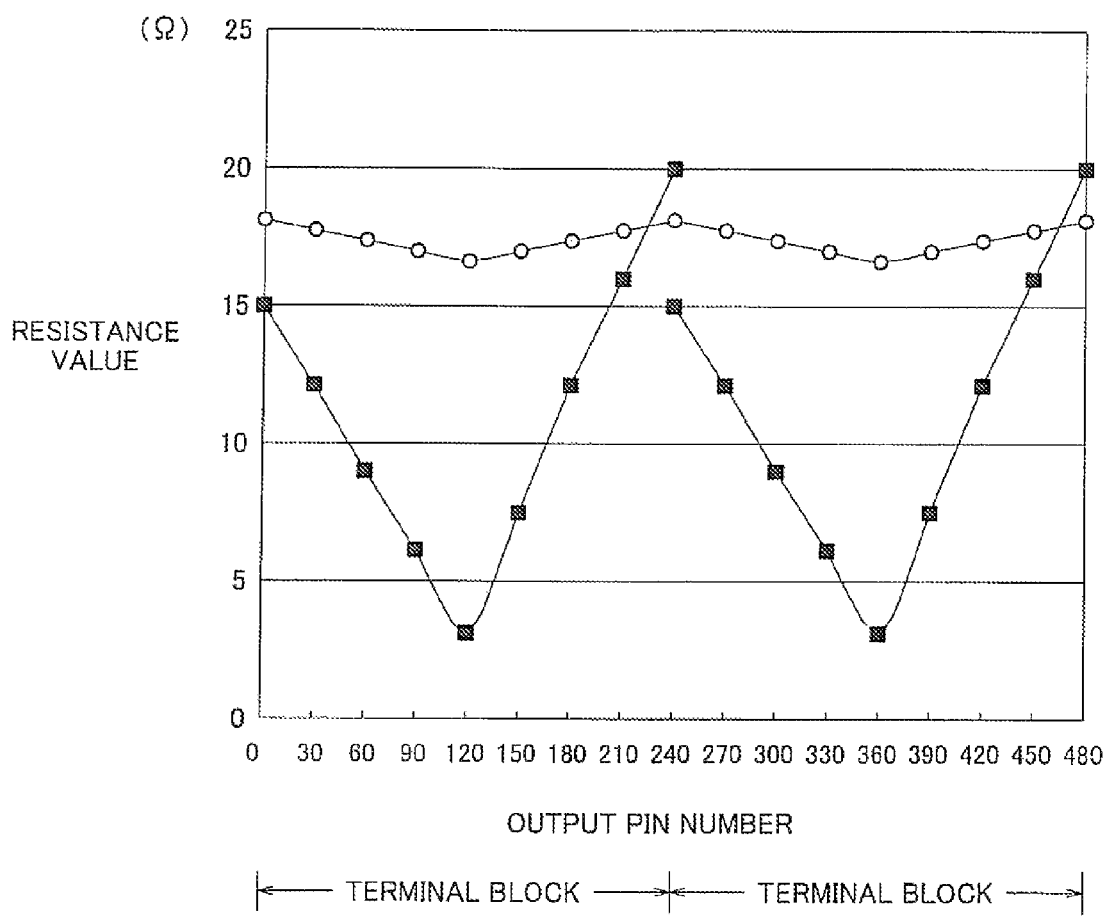
FIG. 14 shows a result of measurement of the resistance value of the interconnection lines with respect to an interconnection line device according to a third exemplary embodiment and an interconnection line device according to a related art.

FIG. 14 shows a result of measurement of the resistance value of the interconnection lines with respect to the interconnection line device according to the third exemplary embodiment and the interconnection line device according to the related art. In FIG. 14, the resistance value of the interconnection line of the interconnection line device according to the third exemplary embodiment is indicated by a white circle symbol "○" and the resistance value of the interconnection line of the interconnection line device according to the related art is indicated by a black square symbol "■", FIG. 14 is a graph of the resistance value of the interconnection line connected to the output pin of the external connection terminal versus the output pin number of the external connection terminal in the terminal block. Further, the output pin number of the external connection terminal is a serial number.

In FIG. 14, the resistance value of the interconnection line of the interconnection line device according to the related art largely varies and the resistance value of the interconnection line of the interconnection line device according to the third exemplary embodiment varies a little. Namely, in the interconnection line device 30C according to the third exemplary embodiment, the resistance values of the interconnection line 26C in one terminal block 13B are made equal to each other and the resistance values of the interconnection line 26C in both terminal blocks 13B are approximately equal to each other.

As shown in FIG. 14, in the interconnection line device of the related art, the resistance value of the interconnection line located at the end of one terminal block largely differs from the resistance value of the interconnection line that is adjacent to the above interconnection line in the one terminal block and located at the end of another adjacent terminal block. However, in the interconnection line device according to the third exemplary embodiment, the resistance value of the interconnection line located at the end of one terminal block largely does not largely differ from the resistance value of the interconnection line that is adjacent to the above interconnection line in the one terminal block and located at the end of another adjacent terminal block. Accordingly, even when a plurality of interconnection lines are connected to a plurality of terminal blocks separately, an image quality is not largely deteriorated.

As described above, an interconnection line device in which increase of the resistance value of the interconnection line is suppressed and the resistance values of the interconnection line are made sufficiently equal to each other without changing the outside dimensions of the liquid crystal panel can be produced. Therefore, an image display apparatus having high image quality that uses the interconnection line device 30C can be provided.

<5. Fourth Exemplary Embodiment>

Next, a fourth exemplary embodiment of the present invention will be described. Further, the same reference numbers are used for the same structure as the second and third exemplary embodiments and the description thereof will be omitted appropriately. For example, as shown in FIG. 7, the contact hole in the second exemplary embodiment is formed in the end portion area of the outer edge 34 side of the liquid crystal panel of the external connection terminal. In contrast, in the fourth exemplary embodiment, as shown in FIGS. 15 to 17, the position at which the contact hole is formed is changed according to the resistance value of the interconnection line.

Figure 15:
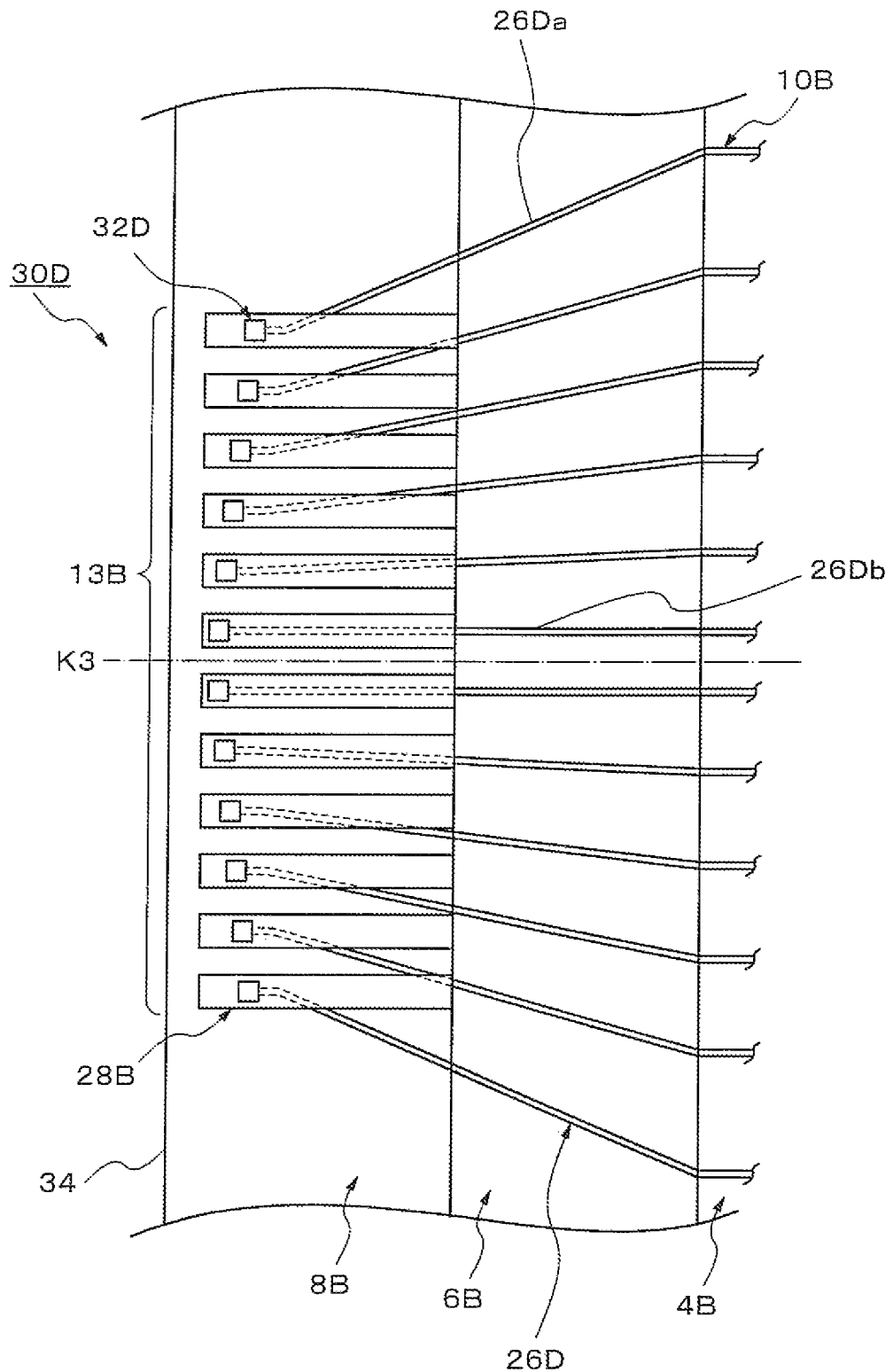
FIG. 15 is a top view of a liquid crystal panel having an interconnection line device according to a fourth exemplary embodiment of the present invention in which each contact hole is formed in a vicinity of an end portion of an external connection terminal that is far from a frame area.

FIG. 15 is a partial top view of a liquid crystal panel having an interconnection line device 30D in which each contact hole 32D is formed in the vicinity of the end portion of the external connection terminal 28B that is far from the frame area 6B. FIG. 16 is a partial top view of a liquid crystal panel having an interconnection line device 30E in which each contact hole 32E is formed in the vicinity of the end portion of the external connection terminal 28B that is close to the frame area 613. FIG. 17 is a partial top view of a liquid crystal panel having an interconnection line device 30F in which each contact hole 32F is formed so as to be dispersed over the whole area of the external connection terminal 288.

The contact holes 32D, 32E and 32F are formed in the terminal area of the external connection terminal 28B without restriction in a process. Accordingly, as shown in FIGS. 15 to 17, the positions at which the contact holes 32D, 32E and 32F are formed are adjusted so that the lengths of interconnection lines 26D, 26E and 26F will be made approximately equal to each other. When the lengths of interconnection lines 26D, 26E and 26F are made approximately equal to each other, the resistance values of the interconnection lines 26D, 26E and 26F are made equal to each other.

Figure 16:
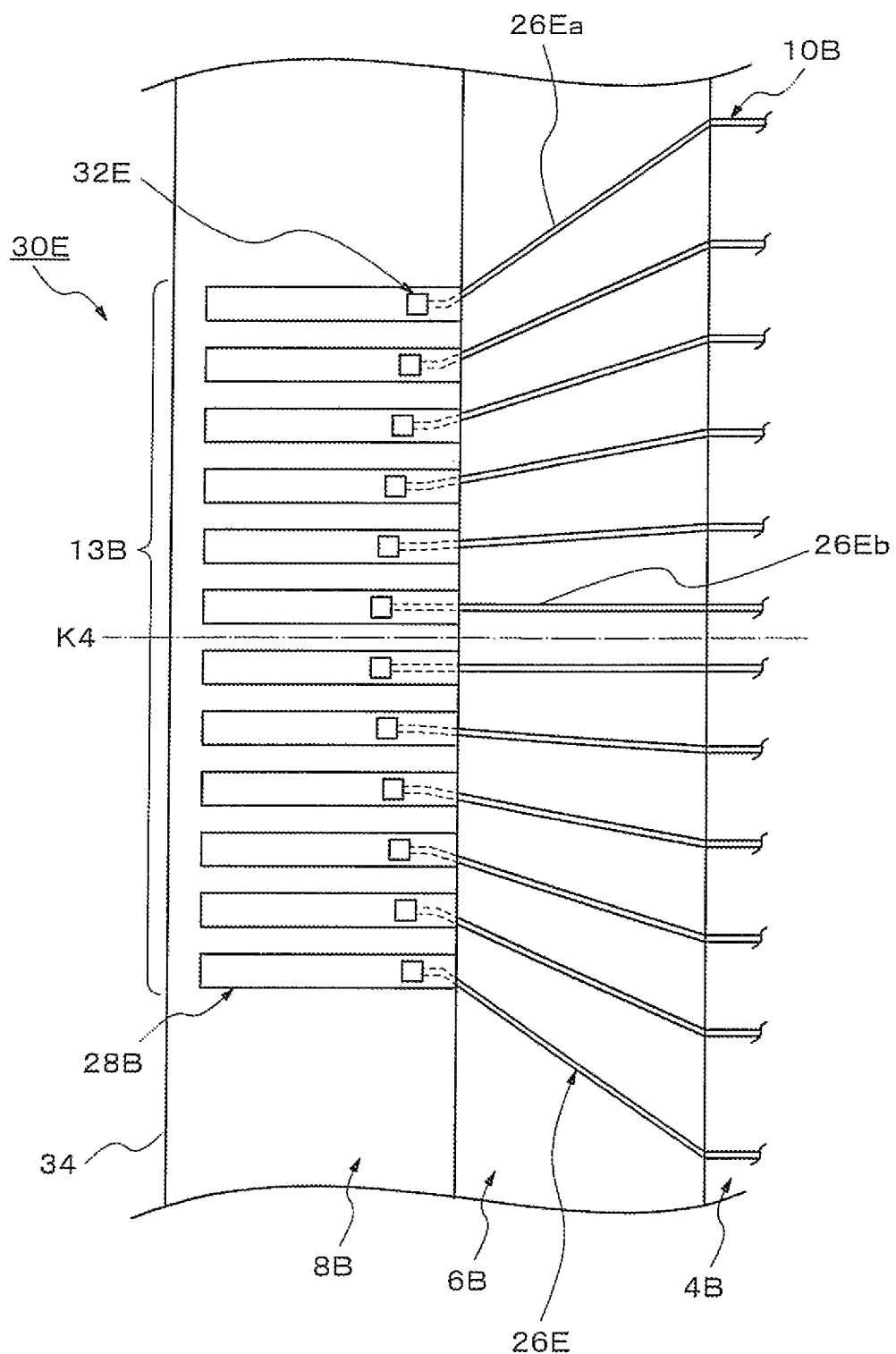
FIG. 16 is a top view of a liquid crystal panel having an interconnection line device according to a fourth exemplary embodiment in which each contact hole is formed in a vicinity of an end portion of an external connection terminal that is close to a frame area.
Figure 17:
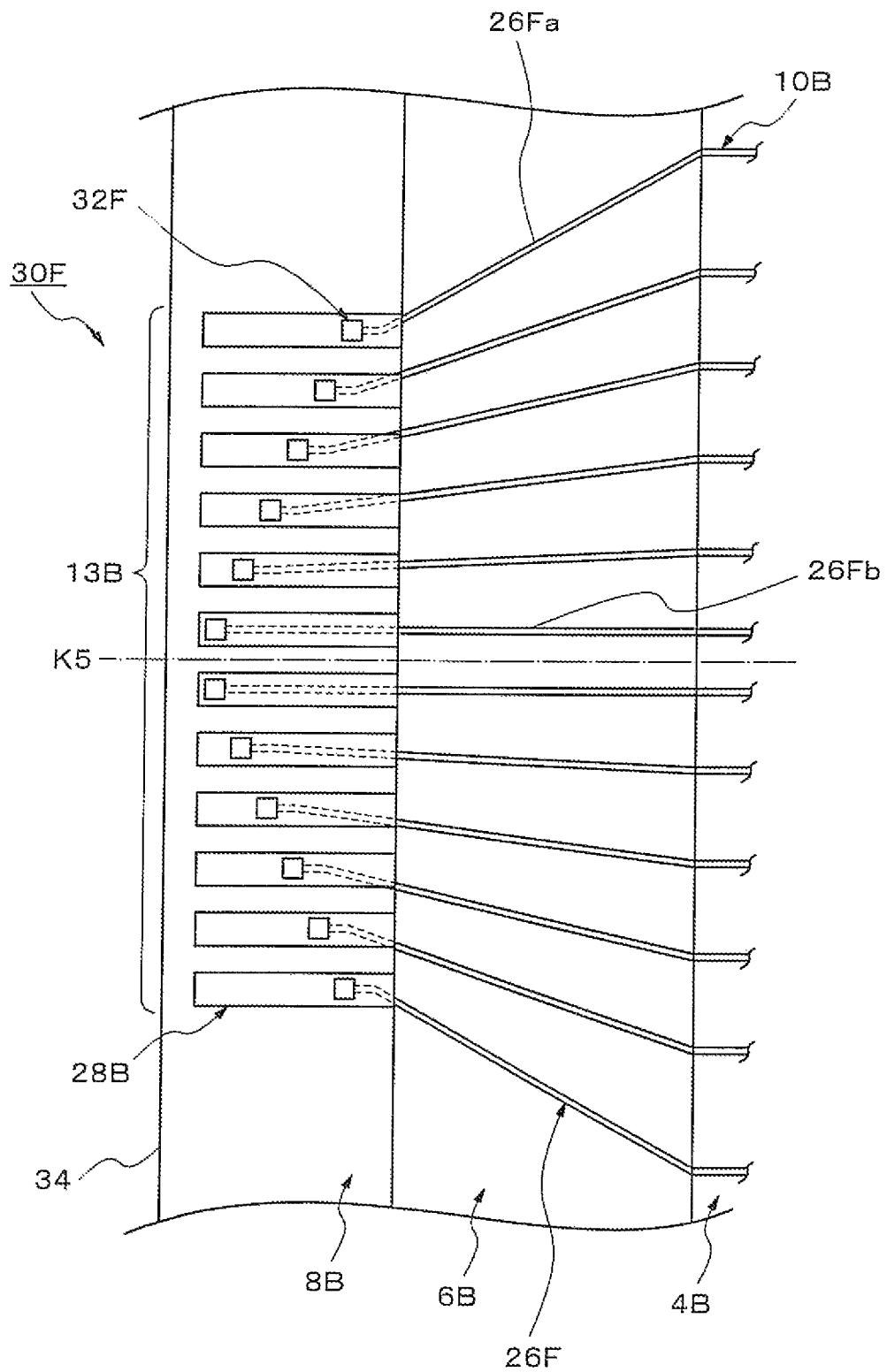
FIG. 17 is a top view of a liquid crystal panel having an interconnection line device according to a fourth exemplary embodiment in which each contact hole is formed so as to be dispersed over the whole area of an external connection terminal.

In FIGS. 15 to 17, the contact holes 32D, 32E and 32F provided on the center line K3, K4, and K5 side of the terminal block 1313 are formed at a position away from the frame area 6B. When the contact holes 32D, 32E and 32F are provided closer to an upper or lower end portion side (end portion side in a direction along the outer edge 34 of the liquid crystal panel) of the terminal block 13B, the contact holes 32D, 32E and 32F are formed closer to the frame area 68. As a result, the lengths of interconnection lines 26Da, 26Ea and 26Fa formed on the upper or lower end portion side of the terminal block 13B are approximately equal to the lengths of the interconnection lines 26Db, 26Eb and 26Fb formed on the center line K3, K4, and K5 side of the terminal block 13B. Thus, the resistance values of the interconnection line 26C can be made equal to each other by adjusting the positions at which the contact holes 32D, 32E and 32F are formed.

Further, the interconnection lines may be formed so as to be arranged symmetrically to the center lines K3, K4, and K5 of the terminal block 13S as shown in FIGS. 15 to 17 and also those may be formed so as to be arranged asymmetrically to the center line K2 of the terminal block as shown in FIG. 3. In each case, the position of the contact hole is adjusted so that the lengths of the interconnection line C are made approximately equal to each other. Thus, the resistance values of the interconnection line can be made sufficiently equal to each other.

As described above, an interconnection line device in which the resistance values of the interconnection line can be made sufficiently equal to each other without changing a basic specification such as the size of the liquid crystal panel or the like can be realized. Therefore, an image display apparatus having high image quality which uses such interconnection line device can be provided.

<6. Fifth Exemplary Embodiment>

Next, a fifth exemplary embodiment of the present invention will be described. In the fifth exemplary embodiment, the interconnection line device according to each exemplary embodiment described above is applied to an image display apparatus. Further, it can be applied to the image display apparatus such as a liquid crystal display apparatus, a plasma display apparatus, an organic EL display apparatus, or the like.

Hereinafter, a case in which the interconnection line device according to the second exemplary embodiment is applied to a liquid crystal display apparatus will be described as an example. In the description, the same reference numbers are used for the same structure as the second exemplary embodiment and the description thereof will be omitted appropriately.

Figure 18:
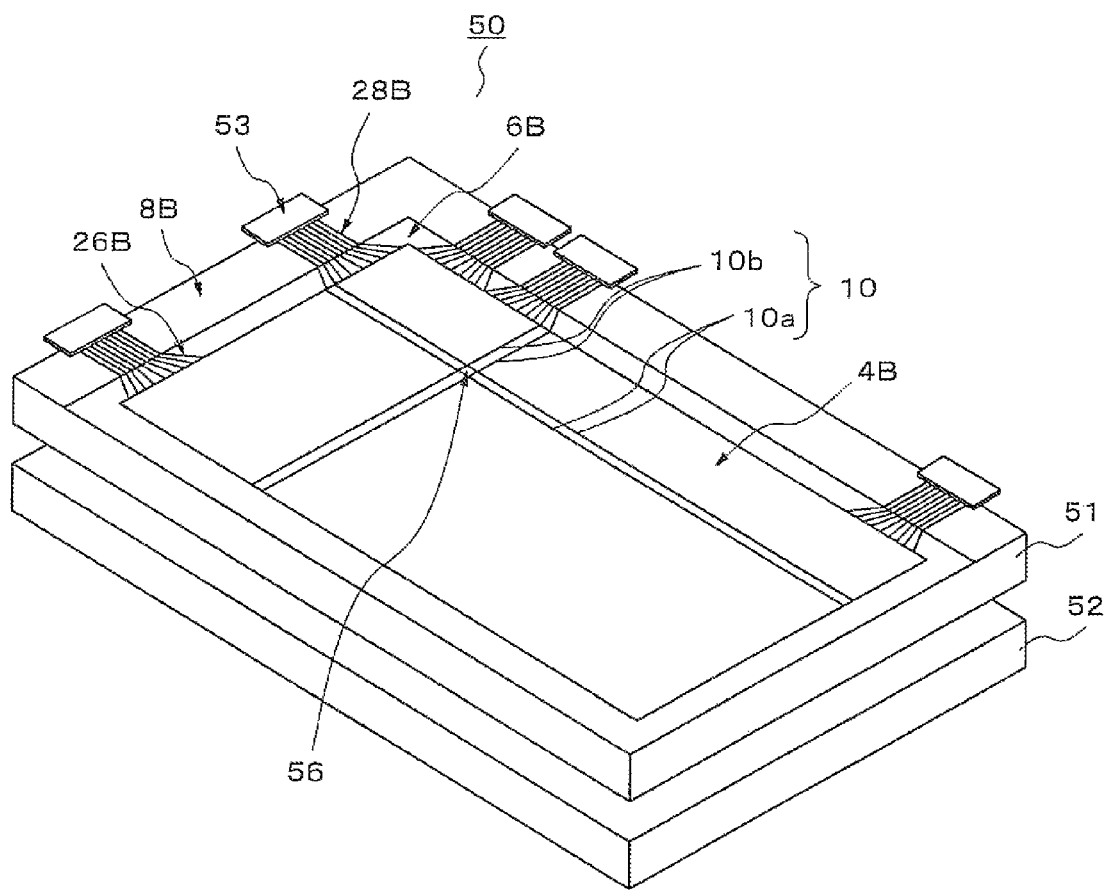
FIG. 18 is a perspective view of a liquid crystal display apparatus which is used for an explanation of a fifth exemplary embodiment of the present invention.

FIG. 18 is a perspective view of a liquid crystal display apparatus which is used for an explanation of a fifth exemplary embodiment. As shown in FIG. 18, a liquid crystal display apparatus 50 comprises a liquid crystal panel 51 and a backlight 52 as a main component. The liquid crystal panel 51 includes the display area 4B in which an image is displayed in the center portion of the panel, the frame area 6B provided around the display area 4B, and the terminal area 8B provided around the frame area 6B.

A plurality of driving circuits 53 are provided in the terminal area 8B and the terminal of the driving circuit 53 is connected to the external connection terminal 28B. The plurality of scanning lines 10a which are arranged at a predetermined interval and in parallel to each other are provided in the display area 4B. The plurality of data lines 10b which are arranged at a predetermined interval and in parallel to each other are provided so as to be perpendicular to the scanning line 10a. One pixel 56 is formed in an area surrounded by two adjacent scanning lines 10a and two adjacent data lines 10b.

The control signal from the driving circuit 53 is supplied to the signal line 10 such as the scanning line 10a, the data line 10b, and the like via the external connection terminal 28B and the interconnection line 26B and applied to each pixel 56. A transmittance of each pixel 56 is controlled based on this control signal. The backlight 52 emits a light to a liquid crystal panel 51. Because the transmittance of the pixel 56 is controlled, the light from the backlight 52 passes through the liquid crystal panel 51 according to the transmittance of the pixel 56. Accordingly, the image is displayed.

The signal line 10 of such liquid crystal panel 51 is connected to the external connection terminal 28B with the interconnection line 26B, each interconnection line 26B is extended to the terminal area 8B and the resistance values of the interconnection line are made equal to each other. Accordingly, an image display apparatus in which luminance unevenness is reduced and which can display images with high quality can be produced.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

The invention claimed is:

1. An image display apparatus, comprising:
a driving circuit which outputs control signals;
a display panel having pixels which are controlled by said control signals transmitted via predetermined signal lines for a display of an image; and
a plurality of interconnection line devices which include an insulating layer, external connection terminals which are formed on one surface of said insulating layer and connected to said driving circuit, interconnection lines which are formed on another surface of said insulating layer and which are connected to said signal lines at first end portion areas of said interconnection lines, and connection portions which are arranged so as to penetrate through said insulating layer and which connect second end portion areas of said interconnection lines to said external connection terminals,
wherein positions of one or more of the connection portions and widths of the interconnection lines are determined such that resistance values of the interconnection lines are approximately equal to each other.

2. The image display apparatus according to claim 1, wherein said display panel includes
a display area in which an image is displayed,
a frame area which is an area around said display area and in which said interconnection lines are formed, and
a terminal area which is around said frame area and in which said external connection terminals are formed,
wherein said connection portions are formed in said terminal area to connect said external connection terminals to said interconnection lines.

3. The image display apparatus according to claim 1, wherein said connection portions are formed at positions predetermined distances away from the end portions of said external connection terminals.

4. The image display apparatus according to claim 1, wherein a line width of at least one of said interconnection lines is changed at an intermediate point thereof.

5. The image display apparatus according to claim 1, wherein said interconnection lines are formed in straight lines.

6. The image display apparatus according to claim 1, wherein at least one of said interconnection lines is formed in a meandering shape.

7. A method for manufacturing an interconnection line device, comprising the steps of:
- forming interconnection lines;
- forming an insulating layer on said interconnection lines;
- forming connection portions so as to penetrate through said insulating layer; and
- forming external connection terminals on said insulating layer and electrically connecting said external connection terminals to said interconnection lines with said connection portions,
- wherein positions of one or more of the connection portions and widths of the interconnection lines are determined such that resistance values of the interconnection lines are approximately equal to each other.

8. The method for manufacturing an interconnection line device according to claim 7, wherein, in the step of forming connection portions, said connection portions are formed at positions predetermined distances away from the end portions of said external connection terminals.

9. The method for manufacturing an interconnection line device according to claim 7, wherein, in the step of forming interconnection lines, a line width of at least one of said interconnection lines is changed at an intermediate point of said one interconnection line.

10. The method for manufacturing an interconnection line device according to claim 7, wherein, in the step of forming said interconnection lines, said interconnection lines are formed in straight lines.

11. The method for manufacturing an interconnection line device according to claim 7, wherein, in the step of forming said interconnection lines, at least one of said interconnection lines is formed in a meandering shape.

* * * * *